(12) United States Patent
Seino

(10) Patent No.: US 9,783,139 B2
(45) Date of Patent: Oct. 10, 2017

(54) SWITCH MONITORING CIRCUIT

(71) Applicant: ALPS ELECTRIC CO., LTD., Tokyo (JP)

(72) Inventor: Kenichi Seino, Miyagi-ken (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/145,244

(22) Filed: May 3, 2016

(65) Prior Publication Data

US 2016/0349328 A1    Dec. 1, 2016

(30) Foreign Application Priority Data

May 29, 2015    (JP) .................................. 2015-110540

(51) Int. Cl.
*G01R 31/02*    (2006.01)
*B60R 16/023*    (2006.01)
*H01H 9/16*    (2006.01)
*G01R 31/327*    (2006.01)

(52) U.S. Cl.
CPC ........... *B60R 16/023* (2013.01); *H01H 9/167* (2013.01); *G01R 31/3277* (2013.01)

(58) Field of Classification Search
CPC .............. G01R 31/327; G01R 31/3278; G01R 31/3274; G01R 31/3277; G01R 31/006; G01R 31/02; G01R 27/205; H01H 11/0062; H01H 1/0015; H01H 9/167; H04Q 1/20
See application file for complete search history.

(56) References Cited

U.S. PATENT DOCUMENTS

| | | | | |
|---|---|---|---|---|
| 5,585,781 A | * | 12/1996 | Sumida | B60R 16/0315 340/455 |
| 5,912,566 A | * | 6/1999 | Tamura | G05B 9/02 327/18 |
| 7,561,386 B2 | * | 7/2009 | Masuda | H01H 47/002 361/155 |
| 9,465,075 B2 | * | 10/2016 | Edwards | G01R 31/3277 |
| 9,541,604 B2 | * | 1/2017 | Acharya | H01H 47/002 |
| 2011/0227631 A1 | * | 9/2011 | Yamkovoy | H04R 5/033 327/434 |

FOREIGN PATENT DOCUMENTS

JP    2005-160166 A    6/2005

* cited by examiner

*Primary Examiner* — Thang Le
(74) *Attorney, Agent, or Firm* — Brinks Gilson & Lione

(57) ABSTRACT

A switch monitoring circuit has an external input terminal connected to a switch, a voltage applying unit that applies a driving voltage to the external input terminal, a voltage detecting unit that detects a change in the voltage at the external input terminal, a control unit connected to the voltage applying unit and voltage detecting unit, and a charge storage unit connected to the external input terminal and voltage applying unit. The charge storage unit has a voltage applying terminal to which the driving voltage is applied, a first resistive element, one of the terminals of which is connected to the external input terminal and the other of the terminals of which is connected to the voltage applying terminal, and a capacitive element, one of the terminals of which is connected to the voltage applying terminal and the other of the terminals of which is grounded. The capacitive element performs charging from the voltage applying terminal and discharging to the voltage applying terminal.

11 Claims, 6 Drawing Sheets

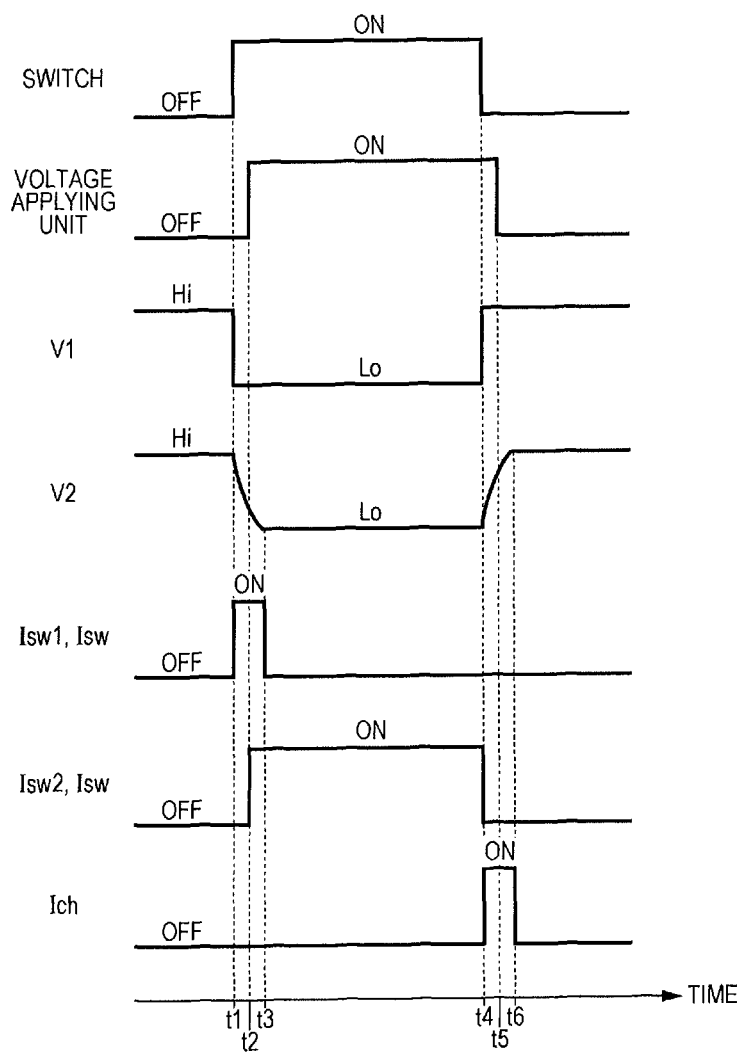

SWITCH MONITORING CIRCUIT

CLAIM OF PRIORITY

This application claims benefit of priority to Japanese Patent Application No. 2015-110540 filed on May 29, 2015, which is hereby incorporated by reference in its entirety.

BACKGROUND

1. Field of the Disclosure

The present disclosure relates to a switch monitoring circuit, and more particularly to a switch monitoring circuit suitable for monitoring the state of a switch used to drive a device mounted on a vehicle, called a vehicle-mounted device.

2. Description of the Related Art

With vehicles such as automobiles, even if the ignition is turned off, an operation may be performed; for example, a window is opened or closed, a door mirror is opened or closed, and a door is locked or unlocked. To allow for this situation, a switch monitoring circuit has been used that monitors the state of a switch used to drive a power window device, a door mirror opening/closing device, a door locking device, or another vehicle-mounted device and notifies a vehicle-mounted engine control unit (ECU) and other electronic units of the monitored switch state.

Conventional switch monitoring circuits are disclosed in Japanese Unexamined Patent Application Publication No. 2005-160166 and other documents. The structure of a conventional switch monitoring circuit will be described below with reference to FIG. 6. FIG. 6 illustrates the structure of a conventional switch monitoring circuit 101.

The conventional switch monitoring circuit 101 disclosed in Japanese Unexamined Patent Application Publication No. 2005-160166 is connected to a switch 110 as illustrated in FIG. 6. The switch 110 is used to drive a vehicle-mounted device (not illustrated) such as a door mirror opening/closing device in response to a manipulation performed by a manipulator. The switch monitoring circuit 101 has a capacitor 112, a voltage applying means 120, a control means including a microcomputer 122 and the like, a voltage detecting means including an input line 124 and the like, and a diode 126.

The voltage applying means 120 is a switch monitoring circuit including a transistor 114, a transistor 116, a battery 118, and the like. The voltage applying means 120 is connected to the switch 110 through wires, connectors, and other elements, which are not illustrated. Upon the receipt of a control signal, called a strobe pulse, from the microcomputer 122, the voltage applying means 120 is activated and applies a voltage to the switch 110.

The switch 110 is a two-terminal switch. One of the terminals of the switch 110 is connected to the voltage applying means 120 through the diode 126, and the other terminal is grounded. While the voltage applying means 120 is operating and the switch 110 is open, the one terminal of the switch 110 is at a predetermined voltage. Otherwise, the terminal is at 0 V.

The microcomputer 122 periodically transmits a control signal to the voltage applying means 120 so that the voltage applying means 120 intermittently operates. The microcomputer 122 monitors the voltage at the one terminal of the switch 110 through the input line 124 and periodically monitors the open/closed state of the switch 110 according to the monitored voltage. The microcomputer 122 is connected to the electronic units described above through wires and other elements, which are not illustrated. The microcomputer 122 notifies the vehicle-mounted ECU and other electronic units of information about the monitored open/closed state of the switch 110.

For a vehicle in which this type of switch monitoring circuit is mounted, there is a constant demand for reducing a current draw on the vehicle side while the ignition is turned off (this current draw is called a dark current) to, for example, assure that charges remain in the battery of the vehicle. To maintain the conductivity of the contacts of a switch and connector for use in a vehicle, for example, there has been a need for flowing the minimum current equal to or higher than a predetermined value between the switch monitoring circuit and the switch.

With a circuit such as the switch monitoring circuit 101 described above, however, the voltage applying means 120 is periodically activated regardless of whether the switch 110 is open or closed and a current draw involved in the operation of the voltage applying means 120 becomes a dark current, which has been a factor that hinders the reduction of the dark current. If the current draw of the voltage applying means 120 is suppressed to reduce the dark current, a current flowing between the switch monitoring circuit 101 and the switch 110 is lessened accordingly. This has led to the possibility that the minimum current between the switch monitoring circuit 101 and the switch 110 cannot be maintained.

SUMMARY

The switch monitoring circuit according to a first embodiment has an external input terminal connected to a switch, a voltage applying unit that performs a driving operation by which a driving voltage is applied to the external input terminal, a voltage detecting unit that detects a change in the voltage at the external input terminal, a control unit connected to the voltage applying unit and voltage detecting unit, and a charge storage unit connected to the external input terminal and voltage applying unit. The charge storage unit has a voltage applying terminal to which the driving voltage is applied, a first resistive element, one of the terminals of which is connected to the external input terminal and the other of the terminals of which is connected to the voltage applying terminal, and a capacitive element, one of the terminals of which is connected to the voltage applying terminal and the other of the terminals of which is grounded, the capacitive element performing charging from the voltage applying terminal and discharging to the voltage applying terminal.

In this structure, the control unit is connected to the voltage applying unit and voltage detecting unit. Therefore, the operation of the voltage applying unit can be controlled according to a detection result obtained from the voltage detecting unit so that it is possible to have the voltage applying unit perform the driving operation only when the switch is manipulated. By having the voltage applying unit perform the driving operation only when the switch is manipulated, a time during which the voltage applying unit operates can be shortened, so a dark current flowing in the voltage applying unit can be easily reduced. In addition, the charge storage unit has the capacitive element, one of the terminals of which is connected to the voltage applying terminal and the other of the terminals of which is grounded, the capacitive element performing charging from the voltage applying terminal and discharging to the voltage applying terminal. Therefore, it is possible to flow a current from the switch monitoring circuit to the switch due to a discharge of the capacitive element from when the voltage applying unit is activated until it stably operates. The charge storage unit also has the first resistive element, one of the terminals of which is connected to the external input terminal and the other of the terminals of which is connected to the voltage applying terminal. Therefore, it is possible to use the first resistive element to limit a current flowing from the switch monitoring circuit to the switch due to a discharge of the capacitive element. Accordingly, a time during which the current flowing from the switch monitoring circuit to the switch lasts can be prolonged. As a result, it is possible to stably flow a current from the switch monitoring circuit to the switch from when the voltage applying unit is activated until it stably operates, and the minimum current between the switch monitoring circuit and the switch can be easily maintained.

BRIEF DESCRIPTION OF THE DRAWINGS

FIG. 5 is a timing diagram related to circuit operations according to an embodiment of the present invention.

DESCRIPTION OF THE EXEMPLARY EMBODIMENTS

Figure 1:
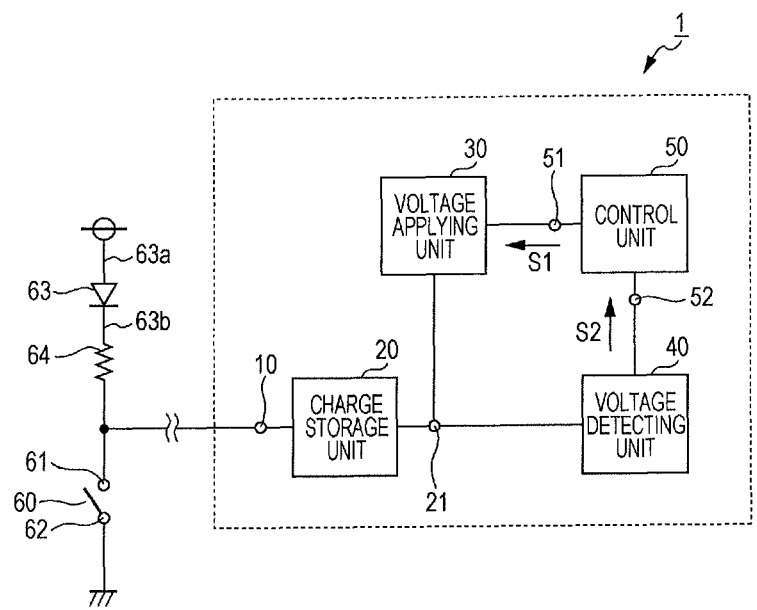
FIG. 1 is a circuit diagram illustrating the structure of a switch monitoring circuit according to an embodiment of the present invention.
Figure 2:
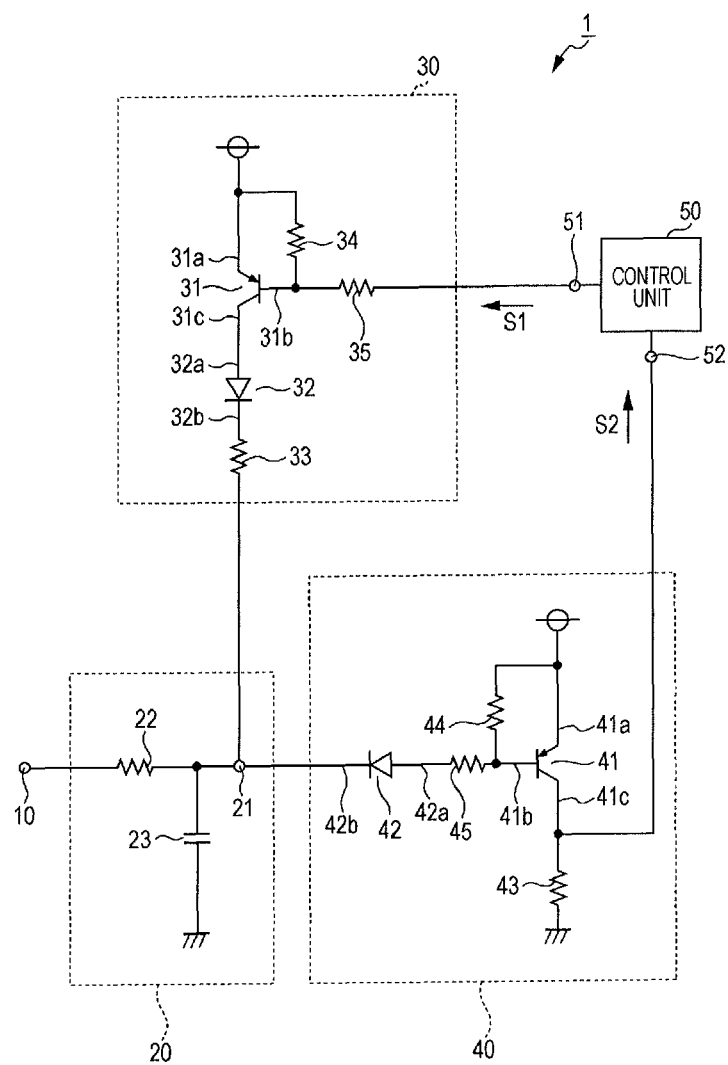
FIG. 2 is a circuit diagram illustrating the structure of a voltage applying unit and a voltage detecting unit according to an embodiment of the present invention.
Figure 3A:
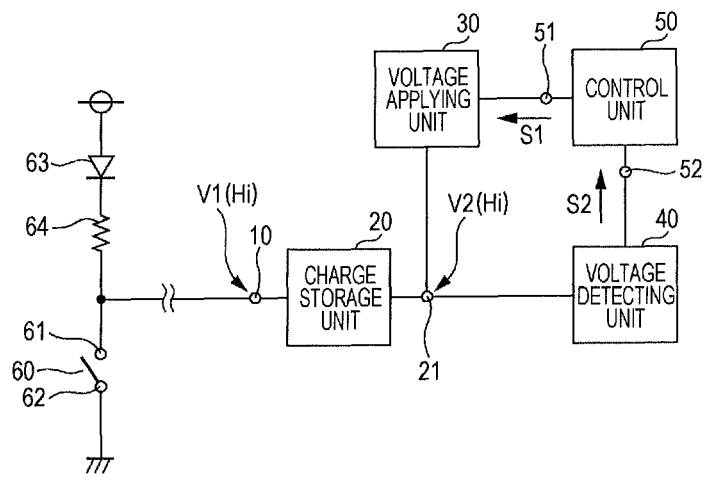
FIGS. 3A and 3B illustrate circuit operations according to an embodiment of the present invention.
Figure 3B:
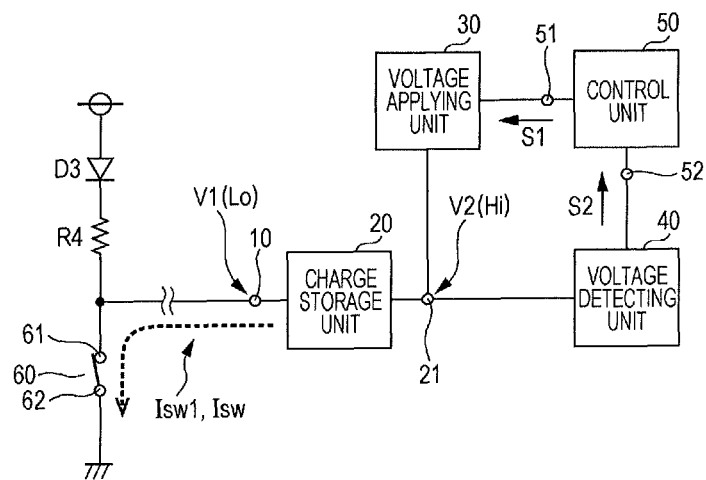
Figure 4A:
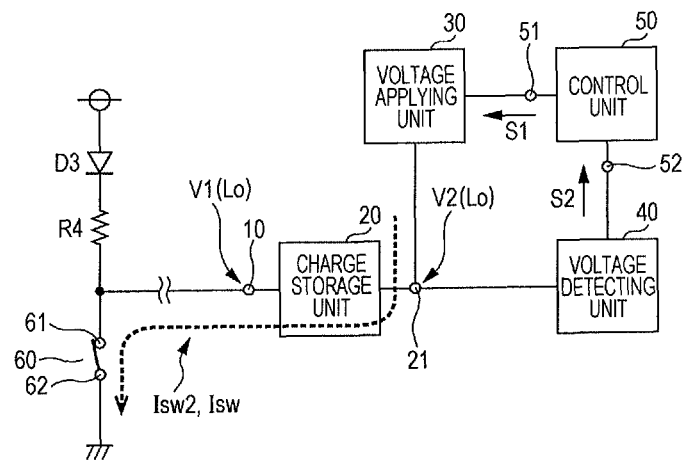
FIGS. 4A and 4B also illustrate circuit operations according to an embodiment of the present invention.
Figure 4B:
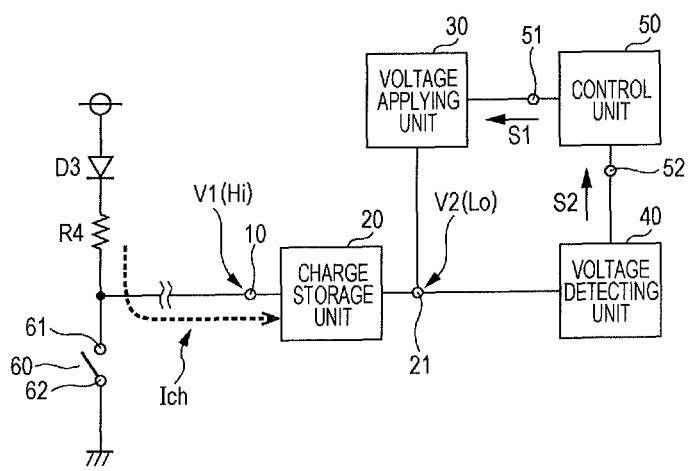
Figure 6:
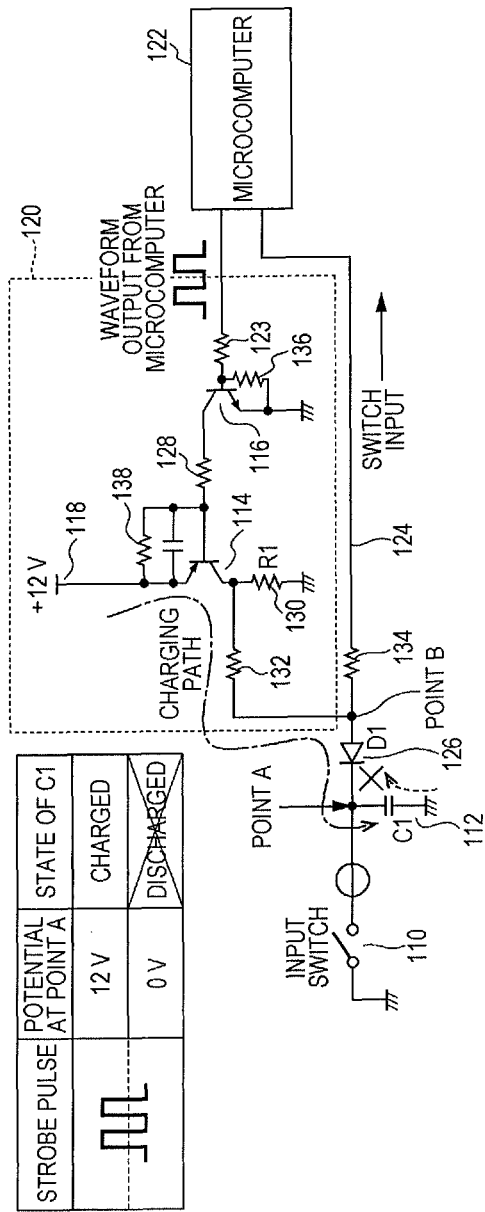
FIG. 6 illustrates the structure of a conventional switch monitoring circuit.

An embodiment of the present invention will be described below with reference to FIGS. 1 to 6. FIG. 1 is a circuit diagram illustrating the structure of a switch monitoring circuit 1 according to an embodiment of the present invention. Specifically, FIG. 1 illustrates the structure of the switch monitoring circuit 1 and the structure of a switch 60 to which the switch monitoring circuit 1 is connected. FIG. 2 is a circuit diagram illustrating the structure of a voltage applying unit 30 and a voltage detecting unit 40 according to an embodiment of the present invention. FIGS. 3A and 3B illustrate circuit operations of the switch monitoring circuit 1 according to an embodiment of the present invention; FIG. 3A illustrates a circuit operation while the switch monitoring circuit 1 is not manipulated and FIG. 3B illustrates a circuit operation immediately after the switch monitoring circuit 1 has been manipulated. FIGS. 4A and 4B also illustrate circuit operations of the switch monitoring circuit 1 according to an embodiment of the present invention; FIG. 4A illustrates a circuit operation while the switch monitoring circuit 1 is stably operating and FIG. 4B illustrates a circuit operation immediately after the manipulation of the switch monitoring circuit 1 has been terminated. FIG. 5 is a timing diagram related to a circuit operation of the switch monitoring circuit 1 according to an embodiment of the present invention. Specifically, FIG. 5 illustrates times at which the switch 60 is manipulated, the operation states of the voltage applying unit 30 at these times, and changes in a voltage V1 at an external input terminal 10, a voltage V2 at a voltage applying terminal 21, a current Isw1, which flows from the switch monitoring circuit 1 into the switch 60 when a capacitive element 23 releases charges, a current Isw2, which flows from the switch monitoring circuit 1 into the switch 60 when the voltage applying unit 30 performs a driving operation, and a current Ich, which flows into the capacitive element 23 to store charges. In FIG. 5, the horizontal axis indicates time.

First, the structure of the switch monitoring circuit 1 according to the embodiment of the present invention and the structure of the switch 60 to which the switch monitoring circuit 1 is connected will be described with reference to FIGS. 1 and 2. The switch monitoring circuit 1 according to the embodiment of the present invention is a switch monitoring circuit that monitors the state of the switch 60. The switch 60 is a manipulable switch used to drive a power window device of a vehicle (not illustrated) or another vehicle-mounted device.

The switch monitoring circuit 1 has the external input terminal 10, a charge storage unit 20, the voltage applying unit 30, the voltage detecting unit 40, and a control unit 50, as illustrated in FIG. 1. The external input terminal 10 is connected to the switch 60. The charge storage unit 20 has the voltage applying terminal 21 to which a driving voltage is applied. The control unit 50 preferably has a control terminal 51 for use in control and a monitor terminal 52 for use in monitoring.

The charge storage unit 20, which is a resistor-capacitor (RC) circuit connected to the external input terminal 10, has a first resistive element 22 and the capacitive element 23 as illustrated in FIG. 2. The first resistive element 22 is a resistor used to limit a current flowing from the switch monitoring circuit 1 into the switch 60. One of the terminals of the first resistive element 22 is connected to the external input terminal 10, and the other terminal of the first resistive element 22 is connected to the voltage applying terminal 21. The driving voltage applied to the voltage applying terminal 21 is applied to the external input terminal 10 as well through the first resistive element 22. The capacitive element 23 stores charges; a capacitive element having a capacitance of several microfarads (μF) such an electrolytic capacitor is used as the capacitive element 23. One of the terminals of the capacitive element 23 is connected to the voltage applying terminal 21, and the other terminal of the capacitive element 23 is grounded.

The voltage applying unit 30 is a switching circuit used to perform the driving operation by which a driving voltage is applied to the external input terminal 10. As illustrated in FIG. 2, the voltage applying unit 30 preferably has a first transistor 31 and a first diode 32. The first transistor 31, which is a PNP-type bipolar transistor, preferably has an emitter terminal 31a used as a power supply terminal, a base terminal 31b used as an input terminal, and a collector terminal 31c used as an output terminal. The first diode 32 preferably prevents a current from flowing from the charge storage unit 20 back into the voltage applying unit 30. The first diode 32 has an anode terminal 32a and a cathode terminal 32b.

The emitter terminal 31a of the first transistor 31 is preferably connected to a power supply. The base terminal 31b of the first transistor 31 is connected to the power supply through a fifth resistive element 34 and is also preferably connected to the control terminal 51 of the control unit 50 through a sixth resistive element 35. A control signal S1 for use in control is transmitted from the control terminal 51 of the control unit 50 to the base terminal 31b of the first transistor 31. The collector terminal 31c of the first transistor 31 is connected to the anode terminal 32a of the first diode 32. The cathode terminal 32b of the first diode 32 is preferably connected to the voltage applying terminal 21 of the charge storage unit 20 through a second resistive element 33, which works as a load resistor. The voltage applying unit 30 performs the driving operation (switching operation) under control of the control unit 50 and applies a voltage to the external input terminal 10 through the charge storage unit 20.

The voltage detecting unit 40 is a switching circuit that detects a change in the voltage at the external input terminal 10. As illustrated in FIG. 2, the voltage detecting unit 40 preferably has a second transistor 41 and a second diode 42. The second transistor 41, which is a PNP-type bipolar transistor, preferably has an emitter terminal 41a used as a power supply terminal, a base terminal 41b used as an input terminal, and a collector terminal 41c used as an output terminal. The second diode 42 preferably prevents a current from flowing from the charge storage unit 20 back into the voltage detecting unit 40. The second diode 42 has an anode terminal 42a and a cathode terminal 42b.

The emitter terminal 41a of the second transistor 41 is preferably connected to a power supply. The base terminal 41b of the second transistor 41 is connected to the power supply through a seventh resistive element 44 and is also connected to the anode terminal 42a of the second diode 42 through an eighth resistive element 45. The collector terminal 41c of the second transistor 41 is preferably connected to the monitor terminal 52 of the control unit 50 and is preferably grounded through a third resistive element 43, which works as a load resistor. The cathode terminal 42b of the second diode 42 is preferably connected to the voltage applying terminal 21 of the charge storage unit 20.

The voltage detecting unit 40 performs an operation (switching operation) in correspondence to a change in the voltage at the voltage applying terminal 21, which is caused by a change in the voltage at the external input terminal 10, and outputs a detection signal S2, the voltage of which changes in correspondence to a change in the voltage at the external input terminal 10. The detection signal S2 output from the voltage detecting unit 40 is transmitted to the collector terminal 41c of the second transistor 41 and the monitor terminal 52 of the control unit 50.

The control unit 50 is a control circuit that controls the driving operation of the voltage applying unit 30. The control unit 50 has an integrated circuit (IC) element (not illustrated) for use in control and the like. The control unit 50 uses the detection signal S2 transmitted from the voltage detecting unit 40 to the monitor terminal 52 of the control unit 50 to monitor a detection result obtained from the voltage detecting unit 40. The control unit 50 uses the control signal S1 transmitted from the control terminal 51 of the control unit 50 to the voltage applying unit 30 to control the voltage applying unit 30. The control unit 50 makes a decision as to the manipulation state of the switch 60 according to the detection result obtained from the voltage detecting unit 40 and controls the driving operation of the voltage applying unit 30 according to the decision result. The method of controlling the driving operation of the voltage applying unit 30 in the embodiment will be described below.

When the detection signal S2 is transmitted from the voltage detecting unit 40 to the monitor terminal 52 of the control unit 50, it decides that the switch 60 has been manipulated and switches the operation state of the switch monitoring circuit 1 to a wake-up state in which the voltage applying unit 30 performs the driving operation. Then, the control signal S1 is transmitted to the voltage applying unit 30, by which the voltage applying unit 30 is activated and executes the driving operation. When the detection signal S2 is not transmitted from the voltage detecting unit 40 to the monitor terminal 52 of the control unit 50, it decides that the switch 60 is in a non-manipulated state and switches the operation state of the switch monitoring circuit 1 to a sleep state in which the voltage applying unit 30 stops the driving operation. Then, the transmission of the control signal S1 to the voltage applying unit 30 is stopped, by which the voltage applying unit 30 stops the driving operation. In this way, the control unit 50 controls the driving operation by the voltage applying unit 30 according to the detection result obtained from the voltage detecting unit 40.

The control unit 50 is also connected to an electronic unit in a vehicle (not illustrated) such as a vehicle-mounted engine control unit (ECU). Therefore, a decision result based on the detection signal S2 and other information are transmitted to the electronic unit. The vehicle-mounted device such as the power window device is operated according to the transmitted information.

The switch 60 is preferably a two-terminal switch having a first terminal 61 and a second terminal 62, as illustrated in FIG. 1, that preferably form an open state or a closed state between them in response to the manipulation performed by the manipulator. In this embodiment, when the switch 60 is in a state in which it is not manipulated (off state), the first terminal 61 and second terminal 62 form an open state between them; when the switch 60 is in a state in which it is manipulated (on state), the first terminal 61 and second terminal 62 form a closed state between them.

The first terminal 61 of the switch 60 is preferably connected to the external input terminal 10 of the switch monitoring circuit 1 through wires, connectors, and other elements, which are not illustrated, and is also preferably connected to a power supply through a third diode 63 and a fourth resistive element 64. The third diode 63 preferably prevents a current from flowing from the switch monitoring circuit 1 back into the power supply disposed on the same side as the switch 60. The third diode 63 has an anode terminal 63a and a cathode terminal 63b. The fourth resistive element 64 is a resistive element that works as a load resistor. The anode terminal 63a of the third diode 63 is connected to the power supply. The cathode terminal 63b of the third diode 63 is connected to one of the terminals of the fourth resistive element 64 and the other terminal of the fourth resistive element 64 is connected to the first terminal 61 of the switch 60. The second terminal 62 of the switch 60 is preferably grounded. The switch monitoring circuit 1 and the switch 60 to which the switch monitoring circuit 1 is connected are structured in this way.

Next, the circuit operation of the switch monitoring circuit 1 will be described with reference to FIGS. 3A and 3B to FIG. 5. In the description below, a state in which the switch 60 is not manipulated (off state) will be simply referred to as the non-operated state, and a state immediately after the switch 60 had been manipulated and has been switched from the off state to the on state will be simply referred to as the immediately-after-manipulation-start state. In the description below, a state in which the switch 60 has been manipulated and the switch monitoring circuit 1 is stably operating will be referred to as the stable operation state, and a state immediately after the manipulation of the switch 60 had been terminated and the switch 60 has been switched from the on state to the off state will be simply referred to as the immediately-after-manipulation-termination state.

In FIGS. 3A and 3B to FIG. 5, the voltage V1 is the voltage at the external input terminal 10 and the voltage V2 is the voltage at the voltage applying terminal 21 of the charge storage unit 20. The voltage at each terminal is a difference in potential between the potential at the terminal and the ground potential (0 V). A state in which the voltage at each terminal has entered a low-voltage state will be referred to as the Lo state, and a state in which the voltage has entered a high-voltage state will be referred to as the Hi state. A current Isw is a current flowing from the switch monitoring circuit 1 into the switch 60 when a capacitive element 23 releases charges or when the voltage applying unit 30 performs the driving operation. Specifically, as described above, the current Isw1 is a current flowing from the switch monitoring circuit 1 into the switch 60 when the capacitive element 23 releases charges, and the current Isw2 is a current flowing from the switch monitoring circuit 1 into the switch 60 when the voltage applying unit 30 performs the driving operation. Also as described above, the current Ich is a current flowing from the power supply on the same side as the switch 60 into the capacitive element 23 to store charges.

In FIG. 5, time t1 is a manipulation start time (a time at which the switch 60 started to be manipulated), time t2 is a time at which the voltage applying unit 30 started the driving operation in response to the start of the manipulation, time t3 is a time at which the switch monitoring circuit 1 entered the stable operation state due to the start of the manipulation, time t4 is a time at which the manipulation was terminated (a time at which the manipulation of the switch 60 was terminated), time t5 is a time at which the voltage applying unit 30 terminated the driving operation in response to the termination of the manipulation, and time t6 is a time at which the switch monitoring circuit 1 returned to the non-manipulated state due to the termination of the manipulation.

First, in the non-manipulate state, the first terminal 61 and second terminal 62 of the switch 60 form an open state between them as illustrated in FIG. 3A and FIG. 5 (before time t1); in this state, the external input terminal 10 is connected to the power supply disposed on the same side as the switch 60 through the third diode 63 and fourth resistive element 64. The capacitive element 23 in the charge storage unit 20 has been charged by a current that has flowed from the power supply disposed on the same side as the switch 60 into the capacitive element 23. As a result, both the voltage V1 and voltage V2 are in the Hi state. Since the first terminal 61 and second terminal 62 of the switch 60 form an open state between them, the current Isw intended to flow from the switch monitoring circuit 1 to the switch 60 does not flow.

Next, when the switch 60 is manipulated, the first terminal 61 and second terminal 62 of the switch 60 form a closed state between them as illustrated in FIG. 3B and FIG. 5 (from time t1 to time t2), and the external input terminal 10 is thereby grounded through the switch 60. As a result, the voltage V1 is switched from the Hi state to the Lo state. In the immediately-after-manipulation-start state, the capacitive element 23 remains charged, so the voltage V2 is in the Hi state. Due to a discharge of the capacitive element 23, the current Isw1 flows from the charge storage unit 20 in the switch monitoring circuit 1 into the switch 60. Due to a discharge of the capacitive element 23, the voltage V2 is gradually lowered. When the current Isw1 flows, it is limited by the first resistive element 22 disposed between the capacitive element 23 and the external input terminal 10, so a time during which the current Isw1 lasts can be prolonged.

Next, when the voltage V2 drops due to the discharge of the capacitive element 23 and enters the Lo state as illustrated in FIG. 4A and FIG. 5 (from time t2 to time t4), the voltage detecting unit 40 starts to operate in response to the change in the voltage V2 at that time and the detection signal S2 is transmitted from the voltage detecting unit 40 to the control unit 50. Then, the control unit 50 is switched from the sleep state to the wake-up state, and the voltage applying unit 30 starts the driving operation. Due to the driving operation by the voltage applying unit 30, the current Isw2 stably flows from the voltage applying unit 30 in the switch monitoring circuit 1 to the switch 60.

Next, when the manipulation of the switch 60 is terminated, the first terminal 61 and second terminal 62 of the switch 60 form an open state again between them as illustrated in FIG. 4B and FIG. 5 (from time t4 to time t6), stopping the flow of the current Isw. The external input terminal 10 is connected again to the power supply disposed on the same side as the switch 60 through the third diode 63 and fourth resistive element 64, and the voltage V1 is switched from the Lo state to the Hi state. In the immediately-after-manipulation-termination state, the capacitive element 23 has not been charged, so the voltage V2 is in the Lo state. However, the current Ich used for charging flows from the power supply disposed on the same side as the switch 60 into the charge storage unit 20, charging the capacitive element 23.

As the capacitive element 23 is charged, the voltage V2 gradually rises and changes from the Lo state to the Hi state. The voltage detecting unit 40 stops its operate in response to the change in the voltage V2 at that time, stopping the transmission of the detection signal S2 from the voltage detecting unit 40 to the control unit 50. Then, the control unit 50 is switched from the wake-up state to the sleep state, and the voltage applying unit 30 stops the driving operation. As a result, the switch monitoring circuit 1 returns to the non-manipulated state. The switch monitoring circuit 1 performs a circuit operation as described above in response to a manipulation performed on the switch 60.

Next, effects in this embodiment will be described. With the switch monitoring circuit 1 in this embodiment, the control unit 50 is connected to the voltage applying unit 30 and voltage detecting unit 40. Therefore, the operation of the voltage applying unit 30 can be controlled according to a detection result obtained from the voltage detecting unit 40 so that it is possible to have the voltage applying unit 30 perform the driving operation only when the switch 60 is manipulated. By having the voltage applying unit 30 perform the driving operation only when the switch 60 is manipulated, a time during which the voltage applying unit 30 operates can be shortened, so a dark current flowing in the voltage applying unit 30 can be easily reduced.

In addition, the charge storage unit 20 has the capacitive element 23, one of the terminals of which is connected to the voltage applying terminal 21 and the other of the terminals of which is grounded, the capacitive element 23 performing charging from the voltage applying terminal 21 and discharging to the voltage applying terminal 21. Therefore, it is possible to flow a current from the switch monitoring circuit 1 to the switch 60 due to a discharge of the capacitive element 23 from when the voltage applying unit 30 is activated until it stably operates.

The charge storage unit 20 also has the first resistive element 22, one of the terminals of which is connected to the external input terminal 10 and the other of the terminals of which is connected to the voltage applying terminal 21. Therefore, it is possible to use the first resistive element 22 to limit the current Isw1 flowing from the switch monitoring circuit 1 to the switch 60 due to a discharge of the capacitive element 23. Accordingly, a time during which the current Isw1 lasts can be prolonged. As a result, it is possible to stably flow the current Isw from the switch monitoring circuit 1 to the switch 60 from when the voltage applying unit 30 is activated until it stably operates, and the minimum current between the switch monitoring circuit 1 and the switch 60 can be easily maintained.

In the switch monitoring circuit 1 in this embodiment, the control unit 50 preferably makes a switchover between the sleep state and the wake-up state according to a detection result obtained from the voltage detecting unit 40, so a time at which to have the voltage applying unit 30 perform the driving operation can be easily limited to a time at which the switch 60 is manipulated. As a result, it is further easy to reduce a dark current.

In the switch monitoring circuit 1 in this embodiment, within a period during which the capacitive element 23 is performing a discharge, the control unit 50 preferably makes a switchover from the sleep state to the wake-up state and preferably has the voltage applying unit 30 start the driving operation. Therefore, a switchover is smoothly made between the current Isw1 flowing from the switch monitoring circuit 1 to the switch 60 due to a discharge of the capacitive element 23 and the current Isw2 flowing from the switch monitoring circuit 1 to the switch 60 due to the driving operation performed by the voltage applying unit 30, so the current Isw flowing from the switch monitoring circuit 1 to the switch 60 can be further stabilized.

In the switch monitoring circuit 1 in this embodiment, the voltage applying unit 30 is a switching circuit that includes the first transistor 31. Since this type of switching circuit has a simple structure, the structure of the voltage applying unit 30 can be simplified. In addition, the collector terminal 31c, which is the output terminal of the first transistor 31, is preferably connected to the voltage applying terminal 21 through the first diode 32, so it is possible to prevent a current from flowing from the charge storage unit 20 back into the voltage applying unit 30, and it is thereby easy for the switch monitoring circuit 1 to stably operate.

In the switch monitoring circuit 1 in this embodiment, the voltage detecting unit 40 is a switching circuit that preferably includes the second transistor 41. Since this type of switching circuit has a simple structure, the structure of the voltage detecting unit 40 can be simplified. In addition, the base terminal 41b, which is the input terminal of the second transistor 41, is preferably connected to the voltage applying terminal 21 through the second diode 42, so it is possible to prevent a current from flowing from the charge storage unit 20 back into the voltage detecting unit 40, and it is thereby further easy for the switch monitoring circuit 1 to stably operate.

In the switch monitoring circuit 1 in this embodiment, the first terminal 61 of the switch 60, to which the switch monitoring circuit 1 is connected, is preferably connected to the external input terminal 10 and is also preferably connected to a power supply through the third diode 63 and fourth resistive element 64. Therefore, the voltage at the external input terminal 10 in the non-operated state can be set without being affected by the circuit characteristics of the voltage applying unit 30 and it is thereby easy to stably charge the capacitive element 23. It is also possible to prevent a current from flowing from the switch monitoring circuit 1 back into the power supply, and it is thereby easy for the switch monitoring circuit 1 to stably operate. A voltage across the fourth resistive element 64 can be used to drive a circuit independent of the switch monitoring circuit 1 and for other purposes, so switch functions can be easily diversified.

So far, an embodiment of the present invention has been described. However, the present invention is not limited to the above embodiments. The present invention can be appropriately modified without departing from the intended scope of the present invention.

For example, in the embodiments of the present invention, a terminal, of the first resistive element 22 in the charge storage unit 20 has been connected directly to the voltage applying terminal 21, but the terminal may be connected to the voltage applying terminal 21 through a resistive element or the like. The charge storage unit 20 may have a voltage detection terminal to which the voltage detecting unit 40 is connected separately from the voltage applying terminal 21.

In the embodiments of the present invention, the voltage applying unit 30 may be structured by using an NPN-type bipolar transistor, a field effect transistor, an IC element, or the like. If the first transistor 31 is a transistor having a built-in resistor, the fifth resistive element 34 and sixth resistive element 35 may be eliminated. If there is no risk that a current flowing from the charge storage unit 20 back into the voltage applying unit 30, the first diode 32 may be eliminated. If the functions of the second resistive element 33 can be implemented by the first resistive element 22 or another resistive element, the second resistive element 33 may be eliminated.

In the embodiments of the present invention, the voltage detecting unit 40 may be structured by using an NPN-type bipolar transistor, a field effect transistor, an IC element, or the like. If the second transistor 41 is a transistor having a built-in resistor, the seventh resistive element 44 and eighth resistive element 45 may be eliminated. If there is no risk that a current flowing from the charge storage unit 20 back into the voltage detecting unit 40, the second diode 42 may be eliminated.

In the embodiments of the present invention, the control unit 50 may perform a control operation other than described above or may perform a computation and other operations besides the control operation.

In the embodiment of the present invention, the switch 60 to which the switch monitoring circuit 1 is connected may be a three-terminal switch or another type of switch. Besides the switch monitoring circuit 1, another circuit may be connected to the switch 60.

In the embodiments of the present invention, the switch monitoring circuit 1 may have circuits and functions other than described above. For example, the switch monitoring circuit 1 may charge the capacitive element 23 by using a driving voltage applied by the voltage applying unit 30. In this case, the switch 60 may not be connected to the power supply through the third diode 63 and fourth resistive element 64.

What is claimed is:

1. A switch monitoring circuit comprising:
   an external input terminal connected to a switch;
   a voltage applying unit that performs a driving operation by which a driving voltage is applied to the external input terminal;
   a voltage detecting unit that detects a change in a voltage at the external input terminal;
   a control unit connected to the voltage applying unit and the voltage detecting unit, the control unit having a control terminal used to control the voltage applying unit; and a charge storage unit connected to the external input terminal and the voltage applying unit; wherein the charge storage unit includes:

a voltage applying terminal to which the driving voltage is applied, wherein the voltage applying unit comprises a switching circuit that has a first transistor and a first diode, the first transistor having an input terminal, a power supply terminal, and an output terminal, the first diode preventing a current from flowing back; the input terminal of the first transistor being connected to the control terminal; the power supply terminal of the first transistor being connected to a power supply; and the output terminal of the first transistor being connected to the voltage applying terminal through the first diode and a second resistive element, a first resistive element, including one of terminals of which is connected to the external input terminal and another of the terminals of which is connected to the voltage applying terminal, and a capacitive element, including one of terminals of which is grounded, the capacitive element performing charging from the voltage applying terminal and discharging to the voltage applying terminal.

2. The switch monitoring circuit according to claim 1, wherein the control unit switches an operation state of the switch monitoring circuit between a wake-up state in which the voltage applying unit performs the driving operation and a sleep state in which the voltage applying unit stops the driving operation, and makes a switchover between the sleep state and the wake-up state according to a detection result obtained from the voltage detecting unit.

3. The switch monitoring circuit according to claim 2, wherein within a period during which the capacitive element is performing a discharge, the control unit makes a switchover from the sleep state to the wake-up state and has the voltage applying unit start the driving operation.

4. The switch monitoring circuit according to claim 1, wherein:

the control unit includes a monitor terminal used to monitor the voltage detecting unit;

the voltage detecting unit comprises a switching circuit that has a second transistor and a second diode, the second transistor having an input terminal, a power supply terminal, and an output terminal, the second diode preventing a current from flowing back;

the input terminal of the second transistor is connected to the voltage applying terminal through the second diode;

the power supply terminal of the second transistor is connected to a power supply; and the output terminal of the second transistor is connected to the monitor terminal and is grounded through a third resistive element.

5. The switch monitoring circuit according to claim 4, wherein:

the switch includes a first terminal and a second terminal that form an open state or a closed state between the first terminal and the second terminal in response to a manipulation;

the first terminal of the switch is connected to the external input terminal and is also connected to a power supply through a third diode, which prevents a current from flowing back, and a fourth resistive element; and the second terminal of the switch is grounded.

6. A switch monitoring circuit comprising:

an external input terminal connected to a switch;

a voltage applying unit that performs a driving operation by which a driving voltage is applied to the external input terminal;

a voltage detecting unit that detects a change in a voltage at the external input terminal, wherein the voltage detecting unit comprises a switching circuit that has a second transistor and a second diode, the second transistor having an input terminal, a power supply terminal, and an output terminal, the second diode preventing a current from flowing back; the input terminal of the second transistor being connected to the voltage applying terminal through the second diode; the power supply terminal of the second transistor being connected to a power supply; and the output terminal of the second transistor being connected to the monitor terminal and is grounded through a third resistive element, a control unit connected to the voltage applying unit and the voltage detecting unit, the control unit including a monitor terminal used to monitor the voltage detecting unit; and a charge storage unit connected to the external input terminal and the voltage applying unit; wherein the charge storage unit includes:

a voltage applying terminal to which the driving voltage is applied, a first resistive element, including one of terminals of which is connected to the external input terminal and another of the terminals of which is connected to the voltage applying terminal, and a capacitive element, including one of terminals of which is connected to the voltage applying terminal and another of the terminals of which is grounded, the capacitive element performing charging from the voltage applying terminal and discharging to the voltage applying terminal.

7. The switch monitoring circuit according to claim 6, wherein the control unit switches an operation state of the switch monitoring circuit between a wake-up state in which the voltage applying unit performs the driving operation and a sleep state in which the voltage applying unit stops the driving operation, and makes a switchover between the sleep state and the wake-up state according to a detection result obtained from the voltage detecting unit.

8. The switch monitoring circuit according to claim 7, wherein within a period during which the capacitive element is performing a discharge, the control unit makes a switchover from the sleep state to the wake-up state and has the voltage applying unit start the driving operation.

9. A switch monitoring circuit comprising:

an external input terminal connected to a switch;

a voltage applying unit that performs a driving operation by which a driving voltage is applied to the external input terminal;

a voltage detecting unit that detects a change in a voltage at the external input terminal;

a control unit connected to the voltage applying unit and the voltage detecting unit; and a charge storage unit connected to the external input terminal and the voltage applying unit; wherein the charge storage unit includes:

a voltage applying terminal to which the driving voltage is applied, a first resistive element, including one of terminals of which is connected to the external input terminal and another of the terminals of which is connected to the voltage applying terminal, and a capacitive element, including one of terminals of which is connected to the voltage applying terminal and another of the terminals of which is grounded, the capacitive element performing charging from the voltage applying terminal and discharging to the voltage applying terminal, wherein the switch comprises a first terminal and a second terminal that form an open state or a closed state between the first terminal and the second terminal in response to a manipulation;

the first terminal of the switch is connected to the external input terminal and is also connected to a power supply through a third diode, which prevents a current from flowing back, and a fourth resistive element; and the second terminal of the switch is grounded.

10. The switch monitoring circuit according to claim 9, wherein the control unit switches an operation state of the switch monitoring circuit between a wake-up state in which the voltage applying unit performs the driving operation and a sleep state in which the voltage applying unit stops the driving operation, and makes a switchover between the sleep state and the wake-up state according to a detection result obtained from the voltage detecting unit.

11. The switch monitoring circuit according to claim 9, wherein within a period during which the capacitive element is performing a discharge, the control unit makes a switchover from the sleep state to the wake-up state and has the voltage applying unit start the driving operation.

\* \* \* \* \*